United States Patent [19]

Sivan

[11] Patent Number: 5,324,973
[45] Date of Patent: Jun. 28, 1994

[54] SEMICONDUCTOR SRAM WITH TRENCH TRANSISTORS

[75] Inventor: Richard D. Sivan, Austin, Tex.

[73] Assignee: Motorola Inc., Schaumburg, Ill.

[21] Appl. No.: 55,582

[22] Filed: May 3, 1993

[51] Int. Cl.⁵ .............................................. H01L 29/10
[52] U.S. Cl. .................................... 257/330; 257/393; 257/903
[58] Field of Search ............... 257/330, 331, 332, 334, 257/301, 302, 903, 904, 393; 365/154

[56] References Cited

U.S. PATENT DOCUMENTS

| | | | |
|---|---|---|---|
| 4,881,105 | 11/1989 | Davari et al. | 257/369 |
| 4,890,144 | 12/1989 | Teng et al. | 257/903 |
| 4,920,397 | 4/1990 | Ishijima | 257/903 |
| 5,016,070 | 5/1991 | Sundaresan | 257/302 |
| 5,122,848 | 6/1992 | Lee et al. | 257/903 |
| 5,231,043 | 7/1993 | Chan et al. | 437/52 |

OTHER PUBLICATIONS

R. Eklund, et al. "A 0.5 Micron BiCMOS Technology for Logic and 4Mbit-class SRAM's" IEEE-IEDM, 1989, 425–428.

K. Sunouchi, et al., "A Surrounding Gate Transitor (SGT) Cell for 64/256Mbit DRAMs" IEEE-IEDM, 1989, 23–26.

Primary Examiner—Robert Limanek
Attorney, Agent, or Firm—Jasper W. Dockrey

[57] ABSTRACT

A semiconductor memory cell (10) includes vertically disposed MOS pass transistors (32, 34) and MOS inverters (12, 14) contained in trench structures in a semiconductor substrate (11). An MOS inverter (12) has a toroidal shared-gate electrode (48) overlying the wall surface of a first trench (36). A pass transistor (32) has a gate electrode (84) in a third trench (40). A first buried drain region (62) resides in the substrate (11) adjacent to the first trench (36), and is located a first distance from the substrate surface. A second buried drain region (64) resides in the substrate (11) adjacent to the second trench (32), and is located a second distance from the substrate surface. The inverter (12) and the pass transistor (32) are electrically coupled by the first and second buried layers (62, 64). The channel length (90) of the driver transistor (16) in the inverter (12) and the pass transistor (32) is determined by the first and second distances, respectively. Accordingly, the cell ratio of the memory cell (10) (ratio of W/L values) is also determined by the differential depth of the first and second buried drain regions (62, 64).

8 Claims, 6 Drawing Sheets

SEMICONDUCTOR SRAM WITH TRENCH TRANSISTORS

RELATED APPLICATIONS

Related subject matter is disclosed in copending, commonly assigned patent applications having Ser. No. 07/955,781, filed on Oct. 5, 1992, now U.S. Pat. No. 5,285,093 and Ser. No. 07/887,956, filed on May 26, 1992, now U.S. Pat. No. 5,229,310.

FIELD OF THE INVENTION

This invention relates, in general, to semiconductor devices and to processes for fabricating semiconductor devices, and more particularly to semiconductor memory devices containing vertically disposed MOS transistors, and to a process for fabricating the device.

BACKGROUND OF THE INVENTION

As semiconductor devices become smaller, it becomes necessary to arrange individual components within a device such that minimal separation distances are achieved. The need to design compact component arrangements occurs most significantly in memory devices. Because of the large number of components needed to fabricate a typical dynamic-random-access-memory device (DRAM), or static-random-access-memory device (SRAM), the components must be arranged compactly if the overall device dimensions are not to become excessively large. This problem is especially critical in SRAM devices where a typical individual memory cell contains as many as six separate components. Simple down-sizing of components can only be pursued to the limit of the line-width definition capability of the manufacturing process. Once the line-width definition limits are reached, new design methodology must be employed if further reduction in memory cell area is to be achieved.

One technique for reducing memory cell dimensions, is to place a number of the components in a trench structure, which is sunk into the substrate. However, even with the integration of a trench structure into the memory cell, additional surface area is still necessary for component connections. For example, active surface regions of the cell must be available for the formation of cell nodes. Typically, the formation of cell nodes requires that surface area of electrically conductive layers be exposed by openings in overlying insulating layers. Contact metallization is placed in openings to provide a means of electrically coupling cell interconnects and components together. Depending on the number of components to be electrically coupled together, the formation of the contact can require elaborate metallization structures. In the case of an SRAM memory cell, a structure known in the art as a shared contact, or buried contact, serves to electrically couple the inverters and the pass transistors. The inclusion of a complex, shared contact structure into an SRAM memory cell increases the total amount of substrate surface area needed to fabricate the cell.

The further reduction in substrate surface area required to form a memory cell is limited by the use of conventional contact metallization structures. While development of new methods for interconnecting cell components is needed, the improvement cannot be attained at the expense of cell performance. In particular, SRAM memory cells suffer stability problems as cell size is reduced. To function properly, the SRAM memory cell, when charged, must hold a voltage level, either high (logic 1) or low (logic 0). When reading data from the cell, the charge pulse generated as the pass transistor turns on must not flip the voltage level at the output nodes. Usually this problem is controlled by adjusting the width-to-length (W/L) ratios of the driver transistor relative to the pass transistor. Typically, the channel width (W) is set and the channel length (L) of each transistor is adjusted. Higher cell stability is obtained when the L value of the pass transistors is larger than the L value of the driver transistor. The ratio of the W/L values of the two transistors is known as the cell ratio and is commonly specified to be at least 3.0 or larger. Care must be taken in the design of a memory cell to interconnect cell components in such a way as to avoid a degradation in cell stability. Therefore, additional development of memory cell technology requires that an improved interconnect structure be achieved while not impairing cell stability.

SUMMARY OF THE INVENTION

In practicing the present invention, there is provided a semiconductor memory device having cell nodes formed by electrically coupled buried layers in a semiconductor substrate. The buried cell nodes are contacted by interconnect layers formed in trench structures sunk into the substrate. The buried cell nodes also serve as drain regions for two vertically disposed MOS transistors residing in the semiconductor substrate. The stability of the memory cell is maintained by adjusting the depth of the drain regions in the semiconductor substrate relative to the surface of the substrate. In one embodiment, a semiconductor substrate has first and second trenches therein. A first MOS transistor resides in the first trench. The MOS transistor has a first buried drain region adjacent to the first trench. A second MOS transistor resides in the second trench. The second MOS transistor has a second buried drain region adjacent to the second trench. An electrically-conductive interconnect layer fills a central portion of the second trench and extends onto the surface of the substrate. The second buried drain region electrically couples the interconnect layer to the first buried drain region. Further, a process is provided for fabricating the device.

BRIEF DESCRIPTION OF THE DRAWING

FIGS. 3-1 through 3-7 illustrate, in cross-section, process steps in accordance with the invention showing a sectional view taken along section line 3—3 of FIG. 2; and FIGS. 4-1 and 4-2 illustrate, in cross-section, process steps in accordance with the invention showing a sectional view taken along section line 4—4 of FIG. 2.

Figure 1:
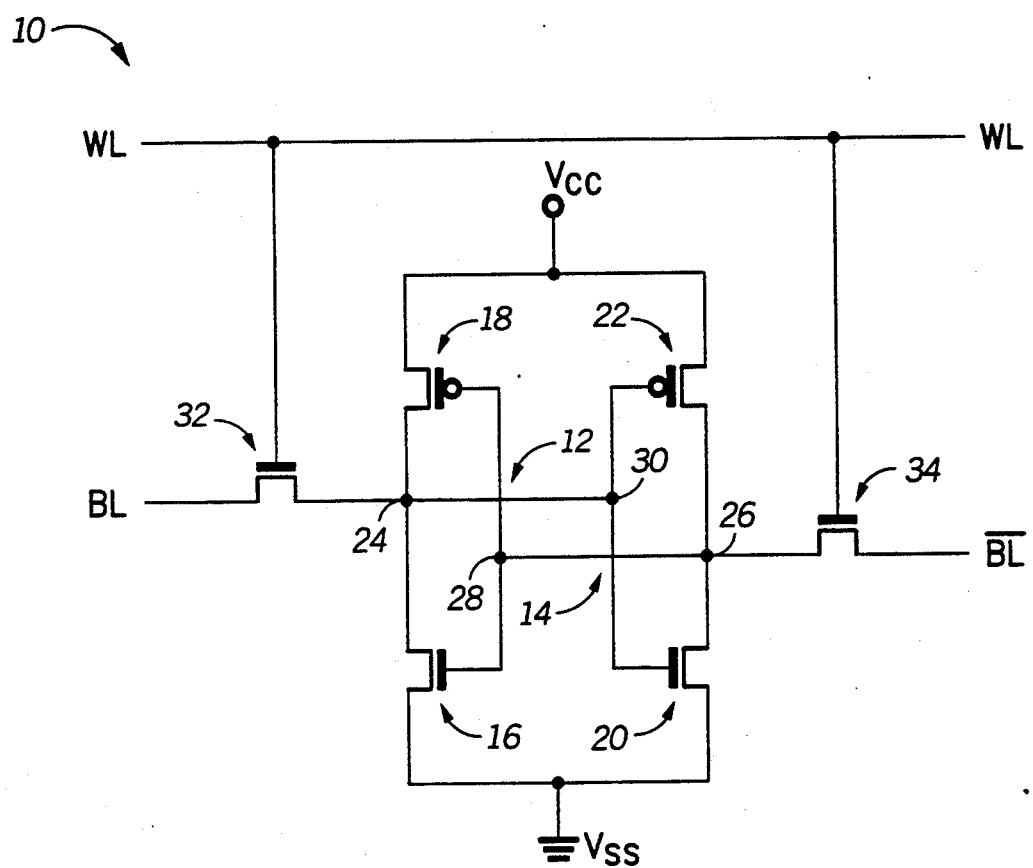
FIG. 1 illustrates a schematic circuit diagram of an SRAM memory cell.

It will be appreciated that for simplicity and clarity of illustration elements shown in the FIGURES have not necessarily been drawn to scale. For example, the dimensions of some of the elements are exaggerated relative to each other for clarity. Further, where considered appropriate, reference numerals have been repeated among the FIGURES to indicate corresponding elements.

DETAILED DESCRIPTION OF THE PREFERRED EMBODIMENTS

Shown in FIG. 1 is a schematic circuit diagram of an SRAM memory cell 10. Memory cell 10 is illustrated in an MOS integrated circuit layout in accordance with the invention in FIG. 2, where like elements have the same reference numbers. Memory cell 10 includes two cross-coupled, MOS inverters 12 and 14. CMOS inverter 12 includes an NMOS transistor 16 and a PMOS thin-film, load transistor 18. Similarly, CMOS inverter 14 includes an NMOS transistor 20 and a PMOS thin-film, load transistor 22. The input of CMOS inverter 12 is coupled to the output of inverter 14 by cell nodes 24 and 30, and the input of CMOS inverter 14 is coupled to the output of inverter 12 by cell nodes 26 and 28. Pass transistors 32 and 34 are coupled to the outputs of inverters 12 and 14 at cell nodes 24 and 26 respectively. Pass transistors 32 and 34 provide bit-line access to memory cell 10. As further illustrated in FIG. 1, a Vcc signal is coupled to the source regions of transistors 18 and 22, and a Vss signal is coupled to the source regions of transistors 16 and 20.

Figure 2:
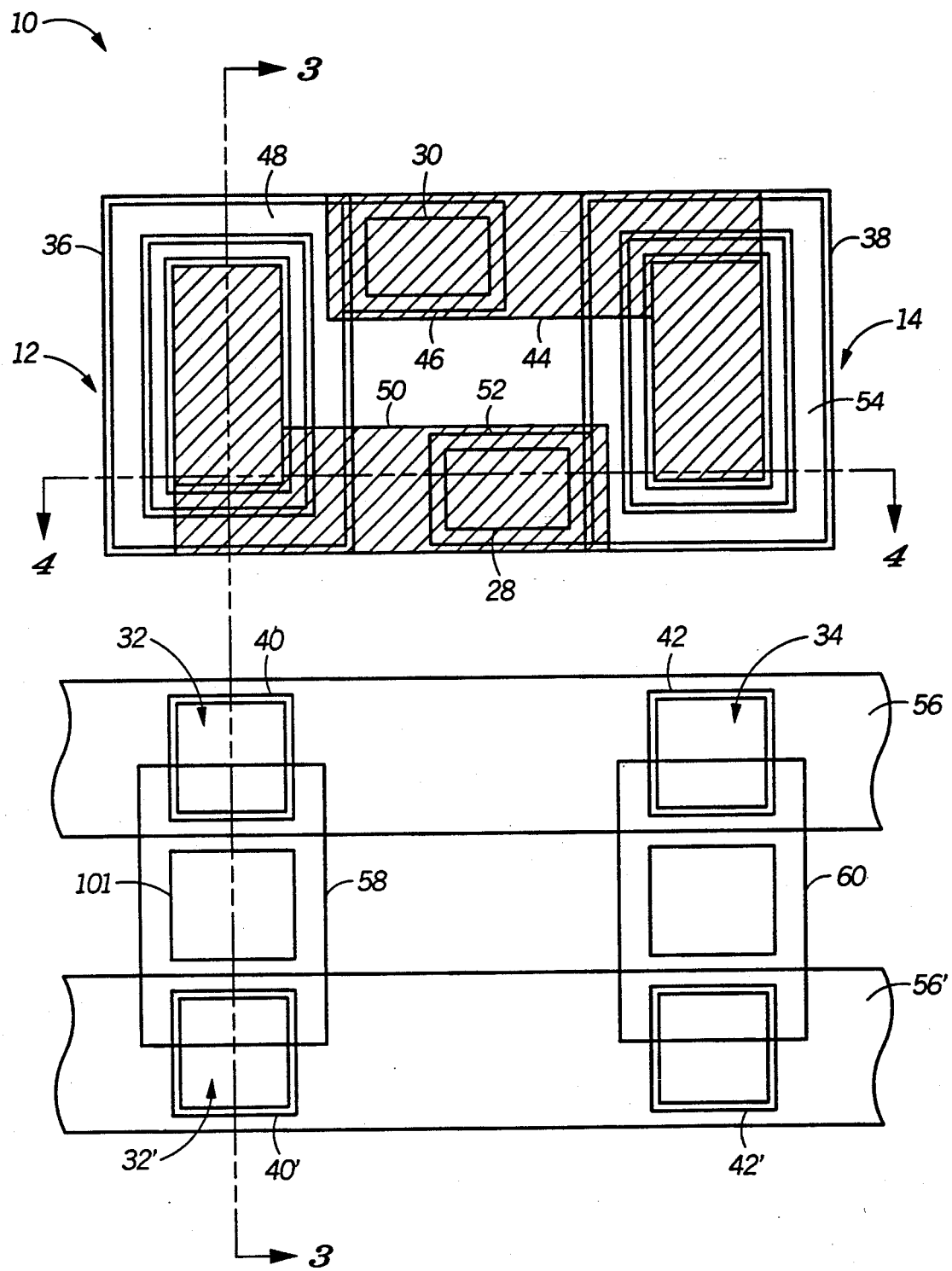
FIG. 2 illustrates a composite layout of an SRAM memory cell in accordance with the invention.

The locations of inverters 12 and 14, and transistors 32 and 34 are illustrated in the plan view of memory cell 10 shown in FIG. 2. Inverter 12 is completely contained within a first trench 36, and inverter 14 is completely contained within a second trench 38. Pass transistor 32 is contained within a third trench 40, and pass transistor 34 is contained within a fourth trench 42. Cell nodes 28 and 30 lie intermediate to first and second trenches 36 and 38. An electrically conductive interconnect layer 44 emerges from trench 38 is coupled to a gate extension 46 at cell node 30. Gate extension 46 is integral with a shared-gate electrode 48 contained in trench 36. Similarly, an interconnect layer 50 emerging from trench 36, is electrically coupled to a gate extension 52 at cell node 28. Gate extension 52 is integral with a shared-gate electrode 54, which is contained in trench 38. A wordline 56 overlies third and fourth trenches 40 and 42, and forms the gate electrode of pass transistors 32 and 34. A second wordline 56' overlies trenches 40' and 42'. Wordline 56' provides wordline access to an adjacent SRAM memory cell (not shown in FIG. 2). The bit-line signals are coupled to memory cell 10 by interconnect layers 58 and 60.

Those skilled in the art will appreciate that the highly symmetrical layout of memory cell 10, formed in accordance with the invention, provides a high-density memory cell requiring minimal substrate surface area. Additionally, a typical integrated circuit contains many memory cells such as memory cell 10. As used herein, the designation "'" after a reference numeral indicates that the designated element is associated with a memory cell adjacent to memory cell 10.

The relationship of the various components of memory cell 10 can be better understood following a description of the sequential process steps used in the fabrication of cell 10. Accordingly, the fabrication of memory cell 10 is illustrated in the sequential process steps shown in FIGS. 3-1 through 3-8. FIGS. 3-1 through 3-8 illustrate, illustrate, in cross section, a portion of memory cell 10 taken along line 3—3 of FIG. 2. Those skilled in the art will recognize that memory cell 10 is inversely symmetrical with respect to the structures sectioned by section line 3—3. Thus, although only structures formed along section 3—3 are illustrated in FIGS. 3-1 through 3-8, corresponding structures are also formed, concurrently, in the opposite side of memory cell 10.

Figures 1, 3:
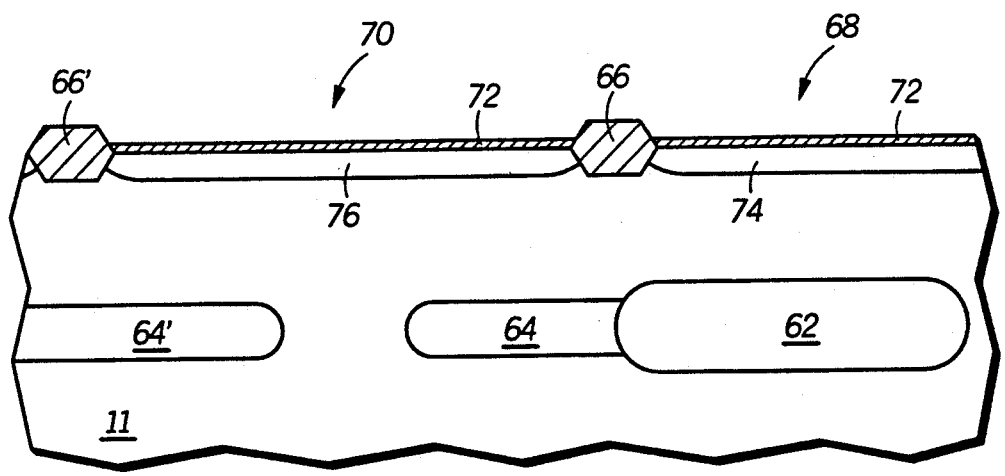
Figures 2, 3:
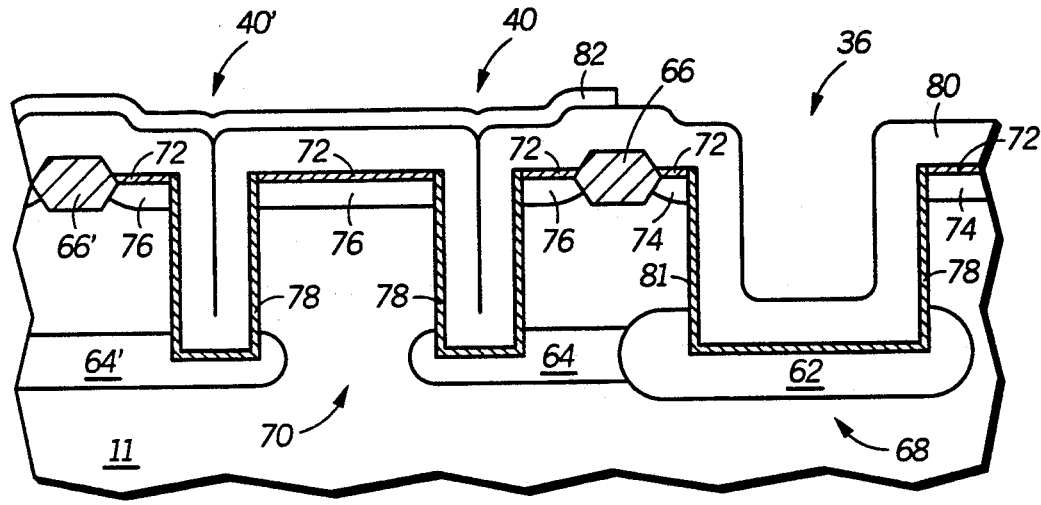
Figure 3:
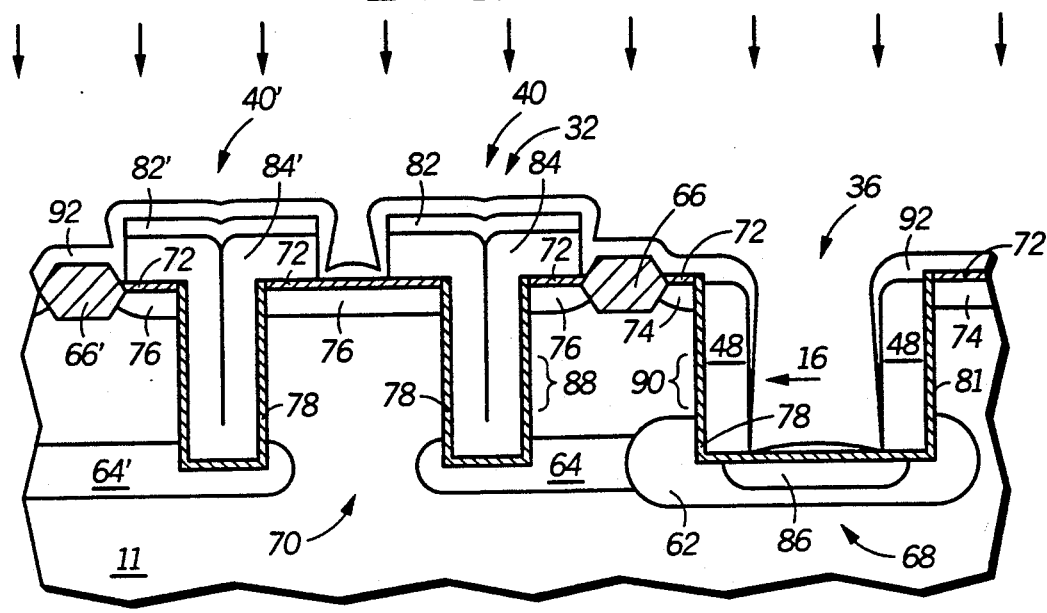

Shown in FIG. 3-1, in cross-section, is a portion of a semiconductor substrate 11 having already undergone several process steps in accordance with the invention. Substrate 11 contains a first buried layer 62 and a second buried layer 64. A field oxide region 66 is disposed at the surface of substrate 11 and divides the surface of substrate 11 into a first active region 68 and a second active region 70. A pad oxide layer 72 overlies the surface of active regions 68 and 70. Doped regions 74 and 76 underlie pad oxide layer 72 in active regions 68 and 70, respectively. Also shown in FIG. 3-1, are buried layer 64' and field oxide region 66'. These features are associated with an adjacent memory cell (not illustrated).

Buried layers 62 and 64 and doped regions 74 and 76 are preferably formed by conventional buried layer and epitaxial growth processes commonly used to form, for example, BiCMOS substrates. In the buried layer formation process, portions of the substrate surface are photolithographically patterned, and an ion implant process is carried out to dope the exposed surface regions of the substrate. Then, the photolithographic pattern is removed and silicon is epitaxially deposited on the substrate surface. As illustrated in FIG. 3-1, buried layer 64 resides at a greater distance below the surface of substrate 11 than buried layer 62. As will subsequently be described, the differential depth of buried layers 62 and 64 provides enhanced cell stability by increasing the cell ratio. In one method, buried layers 62 and 64 are formed by implanting N-type dopant species such as phosphorus, arsenic, or antimony into substrate 11. Each of these dopants has a different diffusivity in silicon. By selecting a different N-type dopant for each buried layer, the difference in dopant diffusivity can be exploited to obtain a different junction depth in substrate 11 after the epitaxial deposition process is complete. In another method, the same N-type dopant species can be used for each buried layer, but the implant operation is performed at a different acceleration energy. The dopant implanted with the highest acceleration energy will reside at a greater depth in the substrate. In this case, since each buried layer is formed with the same N-type dopant, the diffusion rate in the substrate will be the same. However, the final, diffused profile of the buried layer formed with the highest implant acceleration energy will still reside at a greater depth in the substrate than the buried layer formed by a lower energy implant process.

In an alternative process, buried layers 62 and 64 can be formed by high energy ion implantation directly into substrate 11. In this case, an epitaxial deposition process is unnecessary. A high energy ion implant apparatus is used to place dopant atoms at the desired depth into the substrate. Following an annealing process, the buried layers appear substantially as illustrated in FIG. 3-1.

Following either the epitaxial growth process or a high energy implant process, field oxide regions 66 and 66' are formed using a localized-oxidation-of-silicon (LOCOS) process. After completing the LOCOS process, pad oxide layer 72 is formed on the surface of the epitaxial silicon, and an ion implant process is carried out to form doped regions 74 and 76.

As illustrated in FIG. 3-2, first trench 36 is separated from third trench 40 and trench 40' by field oxide region 66. The trenches are fabricated by forming a photolithographic pattern on the surface of substrate 11, then etching away the exposed portion of pad oxide layer 72. Regions of silicon, exposed by photolithographic pattern, are removed by the anisotropic etching of substrate 11. The anisotropic silicon etch is carried out for a period of time sufficient to fully expose portions of buried layers 62, 64′, and 64. After the trench etching process is complete, the photolithographic pattern is removed. A gate oxide layer 78 lines the surface of trenches 36, 40, and 40′. Preferably, gate oxide layer 78 is formed by thermally oxidizing substrate 11. However, gate oxide layer 78 can another dielectric material such as silicon nitride or oxynitride formed by a chemical vapor deposition process.

Following the formation of gate oxide layer 78, a layer of semiconductor material 80 is conformably deposited to fill trenches 40 and 40′, and to overlie the surface of trench 36. Preferably, semiconductor material 80 is polycrystalline silicon deposited by a chemical vapor deposition process. Alternatively, semiconductor layer 80 can be another semiconductor material or composite material. For example, semiconductor layer 80 can be a composite material including polycrystalline silicon and a refractory metal, such as tungsten, molybdenum, titanium, platinum, and the like. A gate installation layer 82 is formed to overlie semiconductor layer 80 in active region 70. Gate installation layer 82 is formed by preferably depositing a thick dielectric layer onto the surface of semiconductor layer 80. Once the installation layer is deposited, a photolithographic pattern is defined and a portion of the installation layer overlying active region 68 is removed by isotropic etching.

Referring to FIG. 3-3, after gate installation layer 82 is initially patterned, another photolithographic pattern is formed and both gate installation layer 82 and semiconductor layer 80 are anisotropically etched to form shared-gate electrode 48, and pass gate electrodes 84 and 84′. The anisotropic etching process forms gate electrodes 80 and 84′ as blocks of semiconductor material, which substantially fill trenches 40 and 40′. Additionally, the anisotropic etch forms shared-gate electrode 48 as a toroidal semiconductor body overlying wall surface 81 of trench 36. After etching semiconductor layer 80, a contact region 86 is formed in substrate 11 at the bottom of trench 86. Preferably, contact region 86 is formed by ion implantation using shared-gate 48 as an implant mask.

Upon completion of the anisotropic etching process, the fabrication of pass transistor 32 and driver transistor 16 is complete. Pass transistor 32 includes a channel region 88, which is electrically isolated from gate electrode 84 by gate oxide layer 78, and is intermediate to second buried layer 64 and doped region 76. Doped region 76 and second buried layer 64 function as the source and drain regions, respectively, of pass transistor 32. Driver transistor 16 includes a channel region 90, which is electrically isolated from shared-gate 48 by gate oxide layer 78, and is intermediate to doped region 74 and first buried layer 62. Correspondingly, doped region 74 and first buried layer 62 function as the source and drain regions, respectively, of driver transistor 16. Pass transistor 32 and driver transistor 16 are both vertically disposed MOS transistors having their drain regions electrically coupled, as illustrated in FIG. 3-3.

In a peripheral substrate region adjacent to memory cell 10 (not shown), a Vss signal lead is electrically coupled to doped region 74 to provide a Vss signal to memory cell 10. Preferably, Vss contacts are created at specified locations in areas of substrate 10 peripheral to a memory cell array. In this manner, individual contacts are not required for every cell. A single contact can provide a Vss signal to a number of memory cells. By servicing a number of memory cells with a single Vss contact, each individual cell can be made smaller.

Those skilled in the art will appreciate that because of the bilateral nature of MOS transistors the designation of a specific doped region as either a source or a drain region is arbitrary. Although doped regions 74 and 76 are referred to as a "source" regions, and buried layers 62 and 64 are referred to as "drain" regions, these labels can change depending upon the direction of current flow through the MOS transistors.

An important aspect of the present invention includes the differential channel lengths of pass transistor 32 and driver transistor 16. The electrical channel lengths (L) of transistors 32 and 16 is defined by the separation distance between the source and drain region of each transistor. Since both transistors have a source region formed by a single doping and diffusion process, the junction depth of the source region is the same for both transistors. Thus, the channel length of transistors 16 and 32 is necessarily determined by the distance from the substrate surface to first buried layer 62, and to second buried layer 64, respectively. As illustrated in FIG. 3-3, the drain region of transistor 32 is further removed from the surface of substrate 11 than is the drain region of transistor 16. The placement of second buried layer 64 deeper into the substrate than first buried layer 62 effectively increases the length of channel region 88 compared to channel region 90. The greater channel length of pass transistor 32 effectively decreases the current gain of the transistor as compared to that of driver transistor 16. As will subsequently be described, the differential channel length of transistors 32 and 16 functions to increase the cell stability of memory cell 10.

After defining the electrodes 48 and 84, a layer of silicon oxide 92 is anisotropically deposited to overlie the horizontally disposed surfaces of substrate 11. Preferably, silicon oxide layer 92 is deposited in a plasma deposition apparatus using tetraethylorthosilane (TEOS). The anisotropic deposition process places substantially all of the silicon oxide onto the horizontally disposed surfaces of substrate 11. As depicted in FIG. 3-3, only a slight amount of silicon oxide overlies the vertical surfaces of substrate 11. This is especially true on the vertical surface of gate 48.

Figures 3, 4:
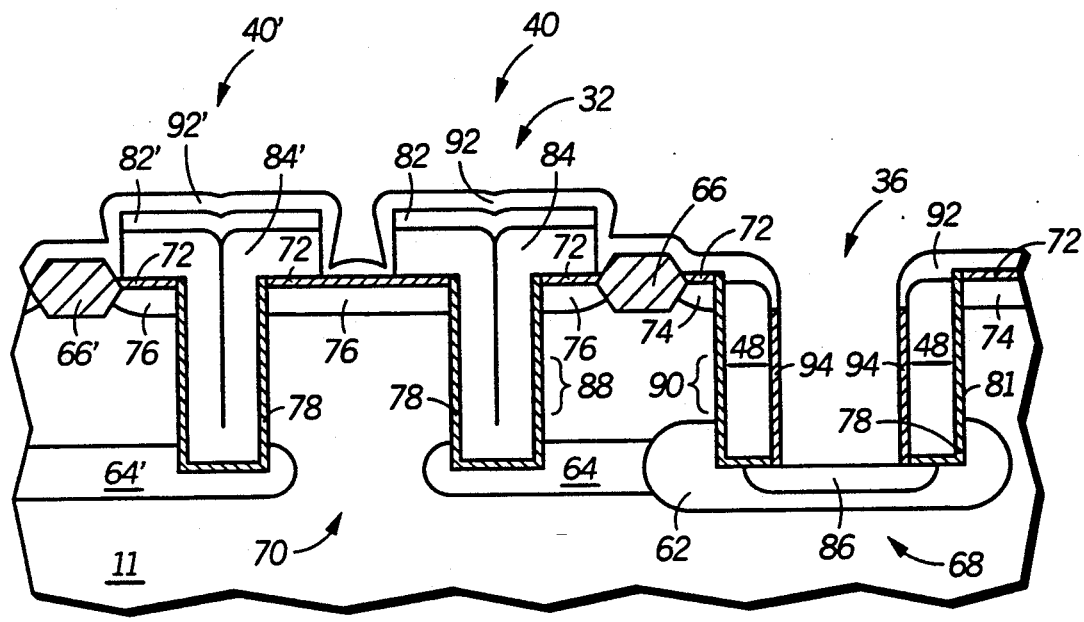

Following the anisotropic deposition of silicon oxide layer 92, a brief isotropic etch is performed to remove the thin layer of silicon oxide material overlying the vertical surface of shared-gate electrode 48. The isotropic etch process also removes portions of silicon oxide layer 92 overlying gate oxide layer 78 in the bottom of trench 36. A thin-film gate oxide layer 94 is then formed over the vertical surface of shared-gate electrode 48, as illustrated in FIG. 3-4. Preferably, thin-film gate dielectric layer 94 is formed by thermally oxidizing shared-gate electrode 48. Alternatively, thin-film gate dielectric layer 94 can be formed by the deposition of a dielectric material, such as silicon oxynitride, silicon nitride, and the like. After thin-film gate dielectric layer 94 is formed, gate dielectric layer 78 is anisotropically etched to remove a portion of layer 78 overlying the bottom surface of trench 36. The removal of dielectric layer 78 exposes contact region 86 at the bottom of trench 36.

Figures 3, 4, 5:
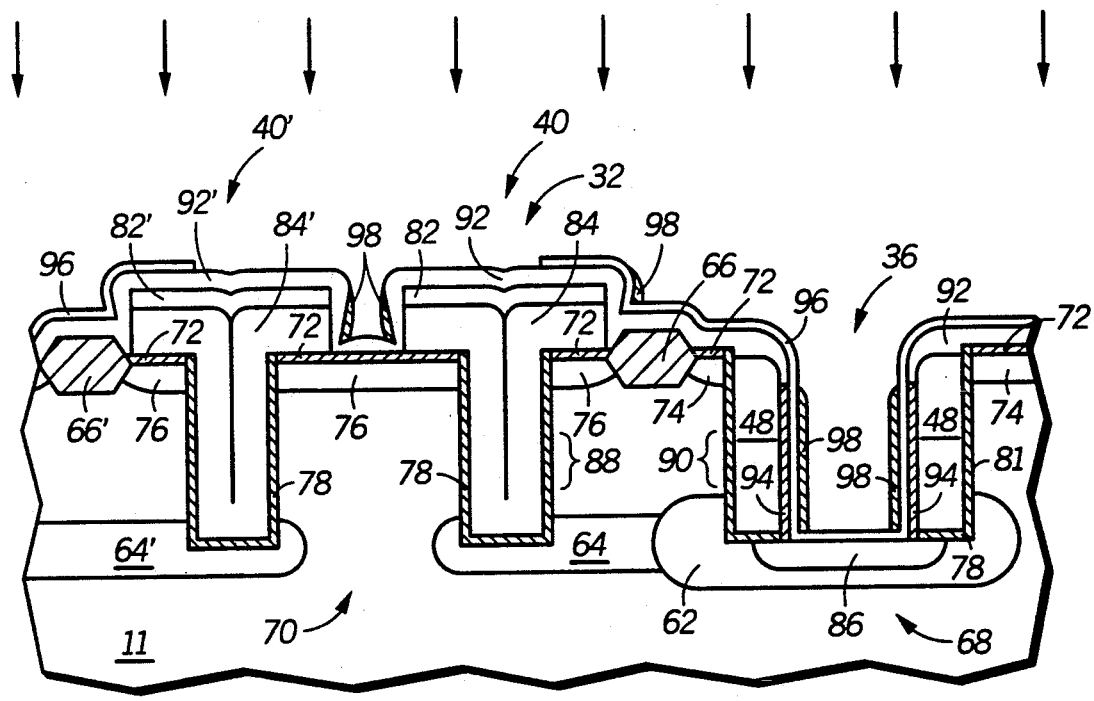
Figures 3, 4, 5, 6:
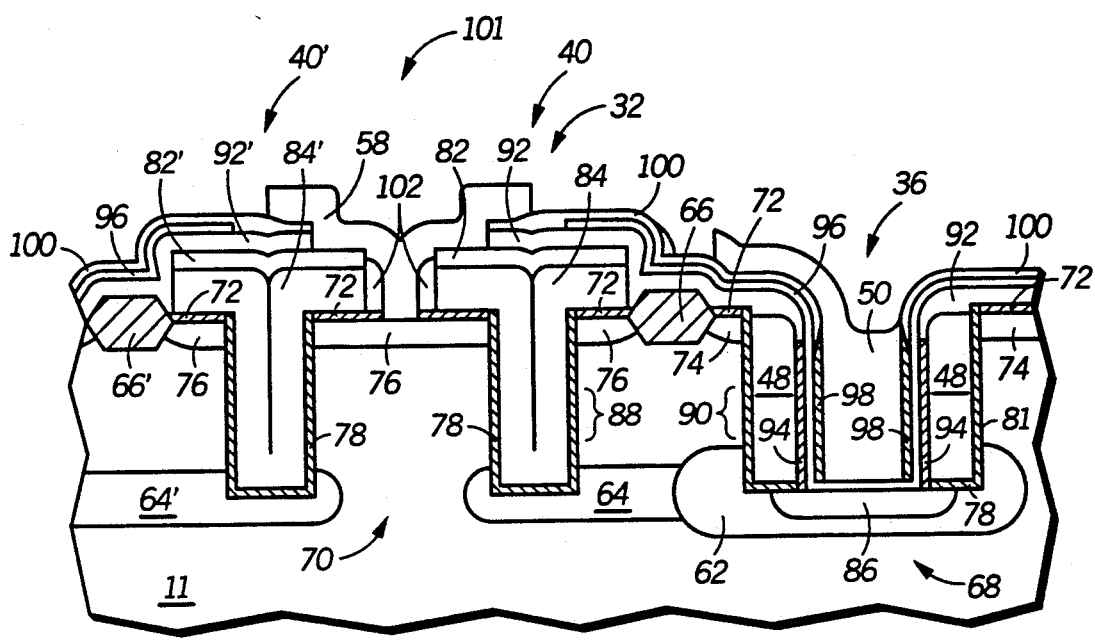
Figures 3, 4, 5, 6, 7:
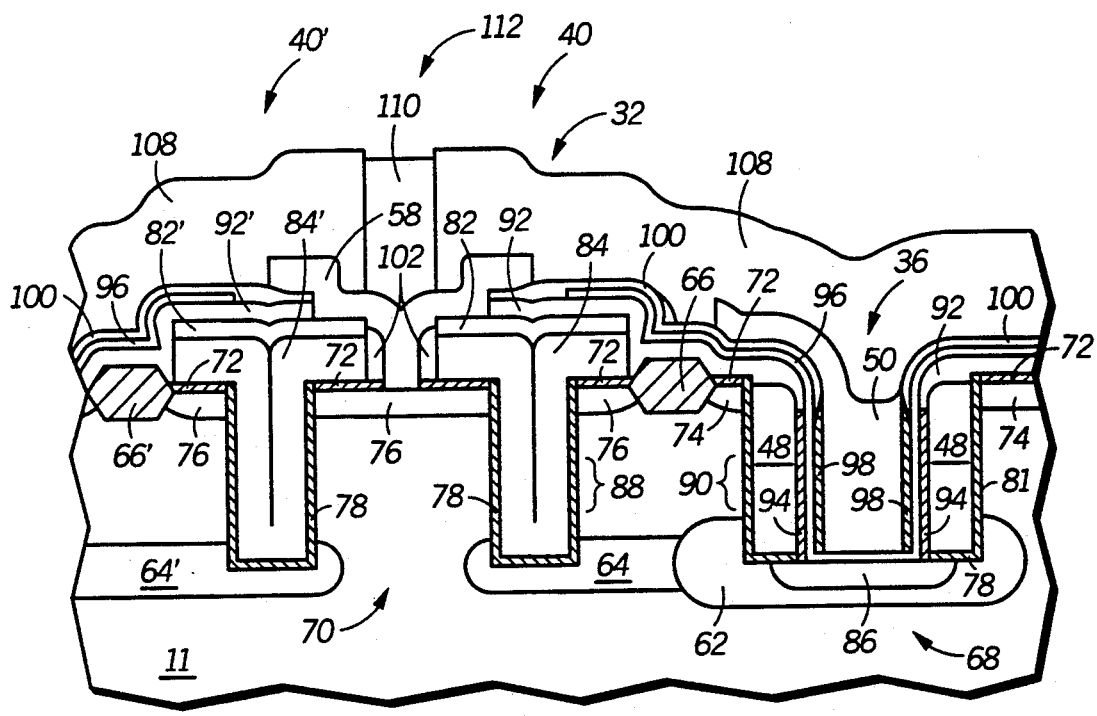
Figures 1, 4:
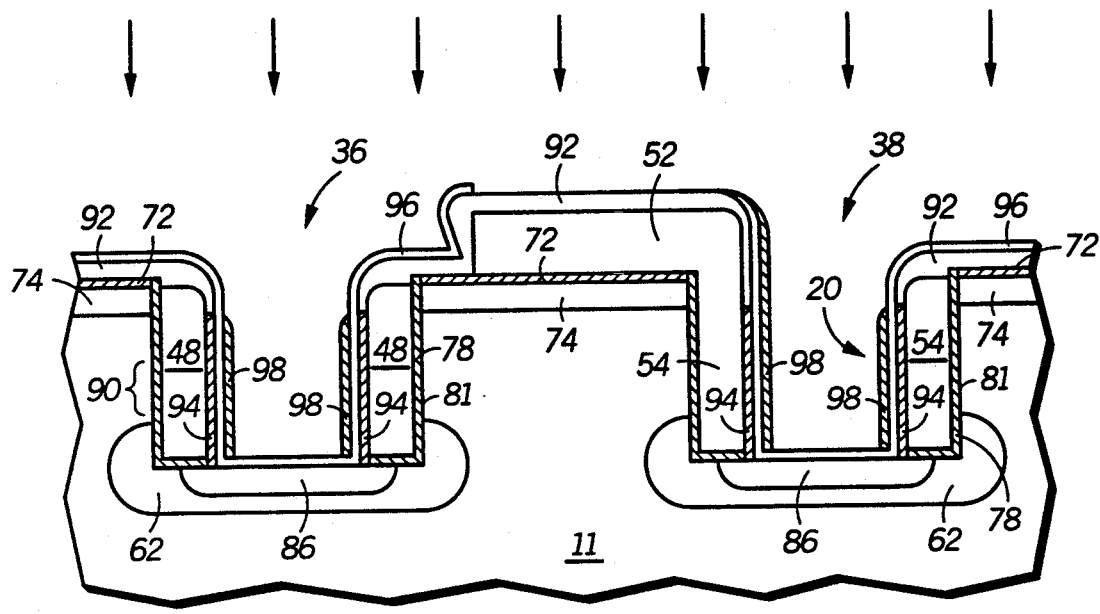
Figures 2, 4:
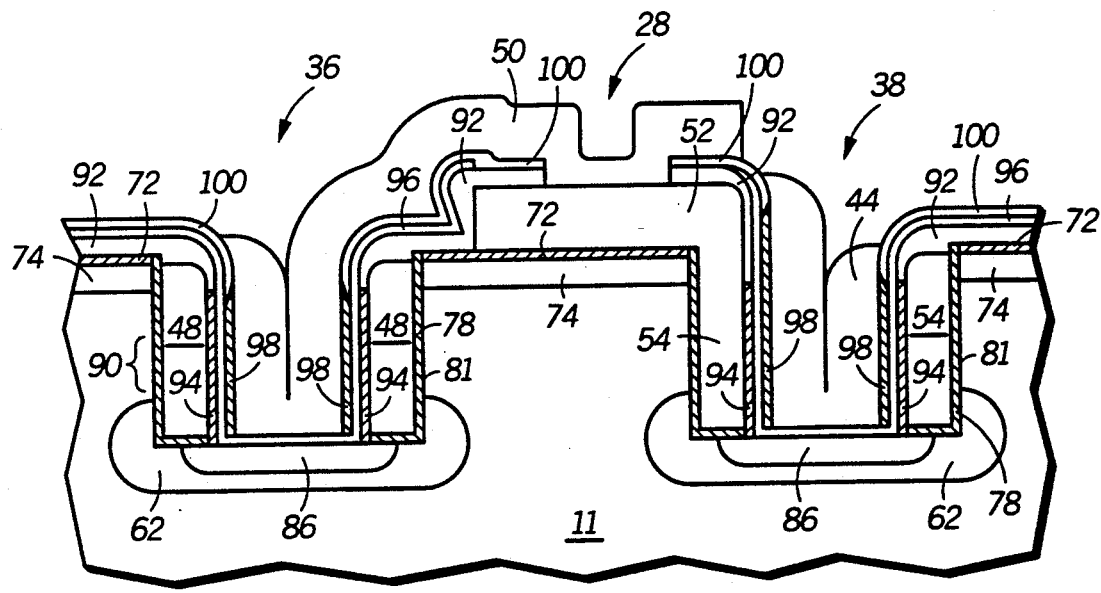

The inventive process continues with the formation of a thin-film channel layer 96, as illustrated in FIG. 3-5. Preferably, thin-film channel layer 96 is formed by the chemical vapor deposition of a semiconductor material such as polycrystalline silicon. Alternatively, thin-film channel layer 96 can be another semiconductor material, such as germanium or a germanium-silicon alloy, or the like. After depositing thin-film channel layer 96, a sidewall spacer 98 is formed on the vertical surfaces of thin-film channel layer 96. As illustrated in FIG. 3-5, sidewall spacer 98 overlies the vertical surface of thin-film channel layer 96 in trench 36. The vertically disposed portion of thin-film channel layer 96, located in trench 36, will become the channel region of thin-film load transistor 18. Once the channel region of thin-film layer 96 is protected by sidewall spacer 98, an ion implant process is performed to dope the unprotected regions of thin-film channel layer 96. In the illustrative embodiment described herein, load transistor 18 is a P-channel transistor. Accordingly, boron doped atoms are ion implanted into the exposed regions of thin-film channel layer 96 to form P-type source-drain regions. The ion implant process places P-type dopants in thin-film channel layer 96 in the bottom of trench 36, and in regions of thin-film channel layer 96 overlying silicon oxide layer 92.

After thin-film channel layer 96 is doped, a photolithographic mask is defined and portions of thin-film channel layer 96 are removed. In one embodiment, thin-film channel layer 96 overlies a substantial portion of the surface of memory cell 10. Portions of the channel layer are only removed in locations where memory cell 10 is to be electrically contacted by an overlying conductive layer. The extensive coverage of memory cell 10 by thin-film channel layer 96 provides an ample surface area for electrically coupling Vcc signal leads to all of the memory cells, such as memory cell 10, in an integrated circuit.

Shown in FIG. 4-1, is a cross-sectional view through memory cell 10 taken along section line 4-4 of FIG. 2. The sectional view illustrated in FIG. 4-1 shows the structural arrangement of inverters 12 and 14 at the same process stage as illustrated in FIG. 3-5. Portions of sidewall spacer 98 overlie the vertical region of thin-film channel layer 96 in trench 38. Shared-gate 54 resides in trench 38 and gate extension 52 extends out of trench 38 and overlies a portion of the surface of substrate 11 intermediate to trenches 36 and 38. Corresponding portions of first buried layer 62 and contact region 86 are shown underlying trench 38. Gate extension 52 provides a region where shared-gate 54 can be electrically contacted by an overlying conductive layer to form cell node 28, shown in FIG. 1.

Returning now to FIG. 3-5, those skilled in the art will appreciate the extent to which thin-film channel layer 96 covers memory cell 10. A typical integrated circuit contains many thousands, or even millions of memory cells, each cell requiring power and ground signals. In the illustrative embodiment, Vcc signals can be provided to a series of memory cells by contacting thin-film channel layer 96 at periodic locations in a memory cell array. As in the case of Vss signal connection, by eliminating the need to access each individual memory cell with an individual Vcc signal lead, the total surface area required to fabricate a large number of cells can be reduced.

FIG. 3-6 illustrates the continued fabrication of memory cell 10 after completing several additional processing steps in accordance with the invention. After doping thin-film channel layer 96 to form P-type source and drain regions, a second silicon oxide layer 100 is anisotropically deposited. Then, a photolithographic pattern is formed and silicon oxide layers 92 and 100 are etched to remove portions of layers 92 and 100 overlying substrate 11 in regions intermediate to trenches 40 and 40 prime. During the etch, a window opening 101 is formed, and sidewall spacers 102 are formed on the exposed vertical surface of gate electrodes 80 and 84'. Next, gate dielectric layer 72 is etched away using sidewall spacer 102 as an etching mask. The etching process exposes a portion of the surface of substrate 11 at doped region 76. The etching process also removes any residual sidewall spacer forming material which may have remained on thin-film channel layer 96 in the bottom of trench 36. Following the etch process, a layer of semiconductor material is deposited by chemical vapor deposition. The semiconductor layer is then photolithographically patterned and etched to form interconnect layers 50 and 58.

Referring to FIGS. 2 and 3-5, interconnect layer 58 contacts a portion of substrate 11 intermediate to wordlines 56 and 56 prime. The portions of wordlines 56 and 56', which fill trenches 40 and 40 prime form gate electrodes 84 and 84', illustrated in FIG. 3-5. A bit-line signal lead may now be electrically coupled to memory cell 10 by contacting interconnect layer 58. Interconnect layer 50 fills trench 36 and has a portion extending out of trench 36 to contact gate extension 52 as shown in FIG. 2. Preferably, interconnect layers 50 and 58 are polycrystalline silicon formed by chemical vapor deposition. Alternatively, interconnect layers 50 and 58 can be another semiconductor materials such a polycide material formed by the combined deposition of polycrystalline silicon and a refractory metal.

At this stage of the process, a portion of memory cell 10 taken along section line 4-4 appears as illustrated in FIG. 4-2. Interconnect layer 50 extends out of trench 36 and contacts gate extension 52 in a region where silicon oxide layers 92 and 100 have been removed. The electrical contact between interconnect layer 50 and gate extension 52 completes cell node 28 illustrated in FIG. 2. Cell node 28 connects the drain regions of driver transistor 20 and load transistor 22.

The process continues, as illustrated in FIG. 3-7, with the deposition of an interlayer dielectric layer (ILD) 108. After ILD layer 108 is deposited, a photolithographic pattern is defined and an opening 112 is etched in the ILD layer to expose a portion of interconnect layer 58. The photolithographic pattern is then removed and a conductive plug 110 is formed in opening 112. Conductive plug 110 is preferably formed by the blanket deposition of a conductive material such as tungsten, titanium, molybdenum, and the like. The deposited material fills opening 112 in ILD layer 108 and overlies the surface of the ILD layer. Following deposition of the conductive material, an etched-back process is carried out to remove portions of the conductive material overlying the surface of ILD layer 108. Following the etched-back process, a smooth surface is obtained upon which additional interconnect layers can be formed. For example, a bit-line signal lead will overlie ILD layer 108 and form an electrical contact to plug 110. The contact metallization provided by interconnect layer 58 and conductive plug 110 electrically couples the bit-line signal to memory cell 110, and also to an adjacent memory cell having pass transistor 32'. Although not illustrated in FIG. 3-7, similar contact metallization structures are provided to electrically couple Vcc signals to thin-film channel layer 96, and Vss signals to doped region 74.

Those skilled in the art will appreciate that the incorporation of a vertically disposed pass gate transistor with a vertically disposed, shared-gate inverter substantially reduces the amount of substrate surface area needed to form a memory cell. Additionally, the cell stability is enhanced by providing a pass transistor, which is electrically coupled to a driver transistor by separate drain regions residing at different depths in the substrate. By forming vertically disposed electrically coupled transistors, the gain current of each transistor is determined by length of the transistor channel in the vertical direction rather than in the horizontal direction. Further, by electrically coupling a pass gate transistor to an inverter in a buried layer, a further reduction in substrate surface area is obtained. Once the pass gate transistor and the inverter are electrically coupled by a buried node, the inverters may be conveniently cross coupled by an interconnect layer electrically contacting the buried node. In the illustrative embodiment, interconnect layer 50 electrically contacts buried node 24, formed by first and second buried layers 62 and 64, and also contacts the shared gate of inverter 14 at node 30. Accordingly, the fabrication of cell nodes 24 and 26 in buried substrate layers permits inverters 12 and 14 to be cross-coupled using simple interconnect layers.

Thus it is apparent that there has been provided, in accordance with the invention, a semiconductor memory device which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the memory cell can be constructed with two wordlines accessing each cell. It is therefore intended to include within the invention all such variations and modifications as fall within the scope of the appended claims and equivalents thereof.

I claim:
1. A semiconductor device comprising:
a semiconductor substrate having a surface;
first and second trenches in the substrate;
a first MOS transistor in the first trench, the MOS transistor having a first buried, drain region adjacent to the first trench;
a second MOS transistor in the second trench, the second MOS transistor having a second, buried drain region adjacent to the second trench; and
an electrically-conductive interconnect layer filling a central portion of the second trench and extending onto the surface of the substrate,
wherein the second buried drain region electrically couples the interconnect layer to the first buried drain region, and
wherein the first buried drain region is located a first distance from the substrate surface, and the second buried drain region is located a second distance from the substrate surface, and wherein the second distance is less than the first distance.

2. The semiconductor device of claim 1 further comprising:
a third trench in the semiconductor substrate; and
a third MOS transistor in third trench, the third MOS transistor having a gate electrode extension overlying a portion of the substrate surface adjacent to the third trench;
wherein the interconnect layer electrically contacts the gate electrode extension.

3. A semiconductor device comprising:
a semiconductor substrate having a surface;
a first and second trenches in the substrate, each trench having a wall surface;
a first drain region at the surface of the substrate adjacent to the first trench;
a second drain region at the surface of the substrate adjacent to the second trench;
a first buried drain region in the substrate adjacent to the first trench and located a first distance from the first drain region; and
a second buried drain region in the substrate adjacent to the second trench and located a second distance from the second drain region,
wherein the second buried drain region electrically contacts the first buried drain region, and
wherein the second distance is less than the first distance.

4. The semiconductor device of claim 3 further comprising:
a first channel region adjacent to the wall surface of the first trench, and corresponding to the first distance;
a first gate electrode in the first trench and electrically isolated from the first channel region by a gate dielectric layer;
a second channel region adjacent to the wall surface of the second trench, and corresponding to the second distance; and
a second gate electrode in the second trench and electrically isolated from the second channel region by the dielectric layer.

5. The semiconductor device of claim 4 further comprising:
an electrically conductive interconnect layer electrically isolated from the first gate electrode and electrically contacting the first drain region.

6. A semiconductor device comprising:
a semiconductor substrate having a surface;
first and second trenches in the substrate;
a first MOS inverter in the first trench and a second MOS inverter in the second trench,
wherein each inverter has a toroidal, shared-gate electrode;
a first gate extension integral with the first shared-gate electrode;
a second gate extension integral with the second shared-gate electrode;
a thin-film channel layer overlying and electrically isolated from the shared-gate electrode of each inverter;
an interconnect layer filling a central portion of each trench,
wherein the interconnect layer in the first trench electrically couples the thin-film channel layer in the first trench to the second gate extension, and
wherein the interconnect layer in the second trench electrically couples the thin-film channel layer in the second trench to the first gate extension;
a third trench in the semiconductor substrate;

an MOS transistor in the third trench, the MOS transistor having a first buried drain region adjacent to the third trench;

a second buried drain region in the substrate adjacent to the first trench, wherein the second buried drain region electrically couples the first buried drain region to the thin-film channel layer in the first trench; and wherein the first buried drain region is located a first distance from the substrate surface, and the second buried drain region is located a second distance from the substrate surface, and wherein the second distance is less than the first distance.

7. The semiconductor device of claim 6, wherein the MOS transistor further comprises:

a first drain region located at the surface of the substrate and adjacent to the third trench;

a gate electrode in the third trench and electrically isolated from the substrate; and a second interconnect layer electrically isolated from the gate electrode and electrically contacting the first drain region.

8. A semiconductor device comprising:

a semiconductor substrate having a surface;

first and second trenches in the substrate;

a first vertically disposed MOS transistor in the first trench;

a second vertically disposed MOS transistor in the second trench, wherein the second MOS transistor is electrically coupled to the first MOS transistor;

a first buried drain region of the first MOS transistor in the substrate adjacent to the first trench and located a first distance from the substrate surface; and a second buried drain region of the second MOS transistor in the substrate adjacent to the second trench and located a second distance from the substrate surface, wherein the first distance is greater than the second distance, and whereby the second transistor has a substantially higher current gain than the first transistor.

* * * * *